(12) United States Patent
Saito et al.

(10) Patent No.: US 10,091,908 B2
(45) Date of Patent: Oct. 2, 2018

(54) HEAT DISSIPATION DEVICE AND METHOD OF DISSIPATING HEAT

(71) Applicant: FUJITSU LIMITED, Kawasaki-shi, Kanagawa (JP)

(72) Inventors: Osamu Saito, Kawasaki (JP); Takaharu Izuno, Kawasaki (JP); Minoru Fujii, Kawasaki (JP); Kenji Joko, Yokohama (JP); Mitsuaki Hayashi, Kawasaki (JP); Hideaki Matsumoto, Yokohama (JP); Katsumi Kanasaki, Machida (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/977,545

(22) Filed: Dec. 21, 2015

(65) Prior Publication Data

US 2016/0212881 A1 Jul. 21, 2016

(30) Foreign Application Priority Data

Jan. 20, 2015 (JP) ................................. 2015-008758

(51) Int. Cl.
*H05K 7/20* (2006.01)
(52) U.S. Cl.
CPC ..... *H05K 7/20163* (2013.01); *H05K 7/20727* (2013.01); *H05K 7/20809* (2013.01)
(58) Field of Classification Search
CPC ............................... F28D 15/0275; F28F 1/32
USPC ..... 361/679.52, 679.54, 697, 700, 709, 719; 29/890.032, 890.043
See application file for complete search history.

(56) References Cited

U.S. PATENT DOCUMENTS

| 5,226,235 A * | 7/1993 | Lesage | F28F 1/32 165/149 |
| 2003/0155104 A1* | 8/2003 | Wenger | F28D 15/0233 165/80.3 |
| 2005/0067149 A1* | 3/2005 | Wu | F28F 1/24 165/104.11 |

(Continued)

FOREIGN PATENT DOCUMENTS

| JP | 2002-299536 | 10/2002 |
| JP | 2003-124413 | 4/2003 |

(Continued)

OTHER PUBLICATIONS

CNOA—Office Action of Chinese Patent Application No. 201610021121.3 dated Aug. 2, 2017 with full English translation. All other references listed in the CNOA were previously cited by the Examiner on Mar. 3, 2017.

(Continued)

*Primary Examiner* — Mukund G Patel
(74) *Attorney, Agent, or Firm* — Fujitsu Patent Center

(57) ABSTRACT

A heat dissipation device includes: a plurality of heat receiving members disposed on a plurality of electronic components mounted on a substrate; a plurality of heat pipes fixed to the respective heat receiving members; and a heat sink mounted on the substrate and includes a plurality of openings formed corresponding to the heat pipes, wherein the heat pipes are inserted in the respective openings, and an inner diameter of the openings in a perpendicular direction to a surface of the substrate is larger than a diameter of the heat pipes in the perpendicular direction to the surface of the substrate.

15 Claims, 18 Drawing Sheets

(56) References Cited

U.S. PATENT DOCUMENTS

| | | | | |
|---|---|---|---|---|
| 2005/0219820 A1* | 10/2005 | Belady | ............... | G06F 1/20 |
| | | | | 361/700 |
| 2011/0075360 A1* | 3/2011 | Tomioka | ............... | G06F 1/20 |
| | | | | 361/695 |
| 2013/0180688 A1* | 7/2013 | Lin | ............... | B22D 17/00 |
| | | | | 165/104.26 |

FOREIGN PATENT DOCUMENTS

| | | |
|---|---|---|
| JP | 2004-186366 | 7/2004 |
| JP | 2011-77403 | 4/2011 |
| TW | M241626 U | 8/2004 |

OTHER PUBLICATIONS

CNOA—Office Action of Chinese Patent Application No. 201610021121.3 dated Apr. 16, 2018 with full English translation.
JPOA—Office Action of Japanese Patent Application No. 2015-008758 dated Jul. 24, 2018 with Full Machine translation.

\* cited by examiner

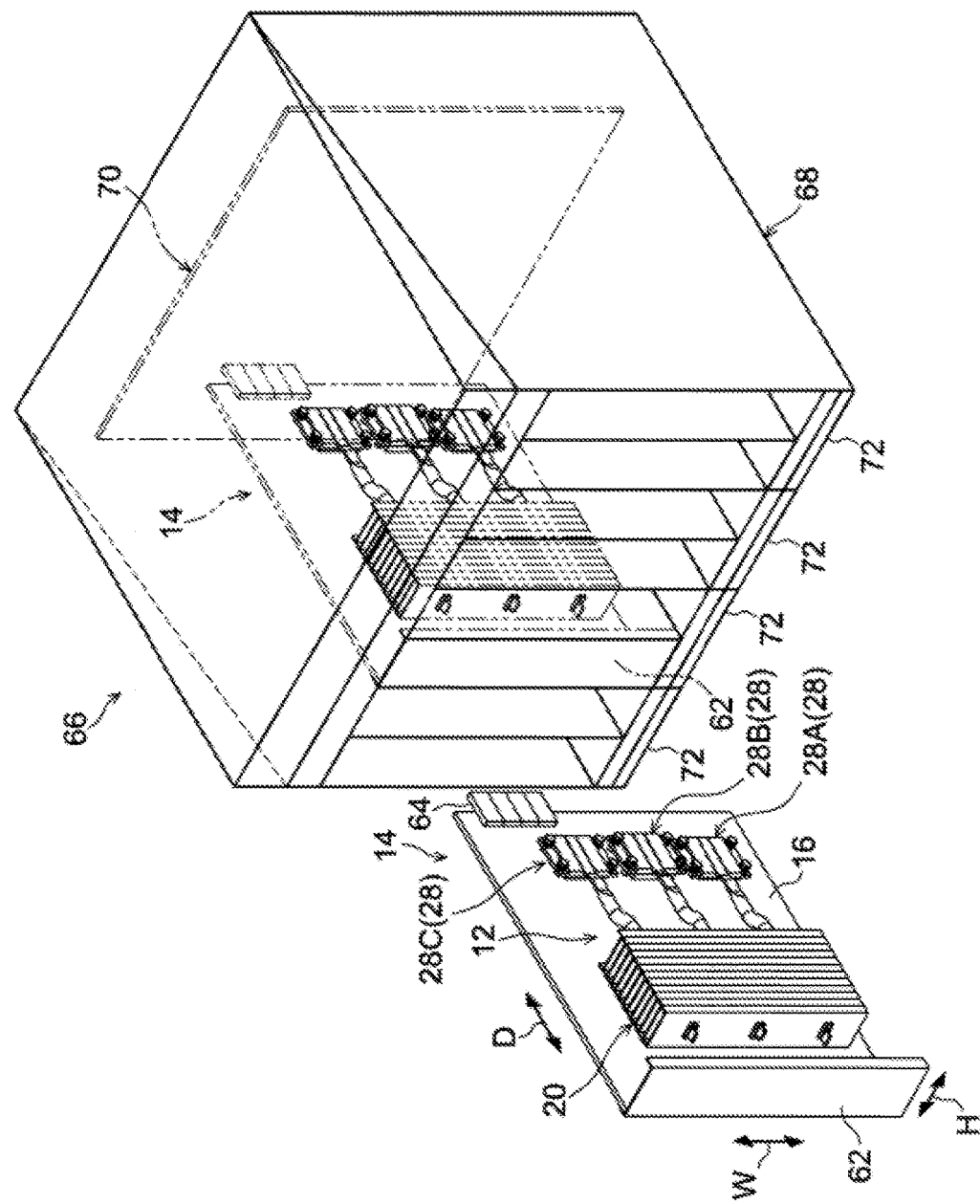

HEAT DISSIPATION DEVICE AND METHOD OF DISSIPATING HEAT

CROSS-REFERENCE TO RELATED APPLICATION

This application is based upon and claims the benefit of priority of the prior Japanese Patent Application No. 2015-008758, filed on Jan. 20, 2015, the entire contents of which are incorporated herein by reference.

FIELD

The embodiments discussed herein are related to a heat dissipation device and a method of dissipating heat.

BACKGROUND

There is a cooling device including a heat pipe; a heat receiving block mounted on one portion of the heat pipe; and a radiating fin mounted on the other portion of the heat pipe.

Also, a structure is known in which a heat pipe is inserted in a thermal conductive member insertion groove located in a fin, and the heat pipe is pressed into the insertion groove of the fin by a spring member.

Furthermore, a structure is known in which a flange is formed in the upper and lower surfaces of a rectangular-shaped opening of the heat sink, and the heat pipe is inserted in the opening and vertically pressed and fixed.

A structure may be adopted in which the heat of a plurality of electronic components on a substrate is received by respective heat receiving members corresponding to the electronic components, and the heat is transferred from a plurality of heat pipes to the common heat sink and dissipated.

Also, the heights of the upper surfaces of the electronic components from the substrate may vary among the electronic components. In this case, when the heat pipes are fixed at a certain height relative to the heat sink, a large gap occurs between a certain pair of an electronic component and a heat receiving member. For instance, even with a structure in which a heat transfer sheet is interposed between the electronic components and the heat receiving members, heat resistance over a route from an electronic component to a heat receiving member is increased at a location where the heat transfer sheet is relatively thick.

The followings are reference documents.
[Document 1] Japanese Laid-open Patent Publication No. 2003-124413,
[Document 2] Japanese Laid-open Patent Publication No. 2002-299536, and
[Document 3] Japanese Laid-open Patent Publication No. 2004-186366.

SUMMARY

According to an aspect of the invention, a heat dissipation includes: a plurality of heat receiving members disposed on a plurality of electronic components mounted on a substrate; a plurality of heat pipes fixed to the respective heat receiving members; and a heat sink mounted on the substrate and includes a plurality of openings formed corresponding to the heat pipes, wherein the heat pipes are inserted in the respective openings, and an inner diameter of the openings in a perpendicular direction to a surface of the substrate is larger than a diameter of the heat pipes in the perpendicular direction to the surface of the substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 18 is a perspective view illustrating an electronic apparatus which includes the substrate unit including the heat dissipation device in the first embodiment.

DESCRIPTION OF EMBODIMENTS

A first embodiment will be described in detail with reference to the drawings.

Figure 1:
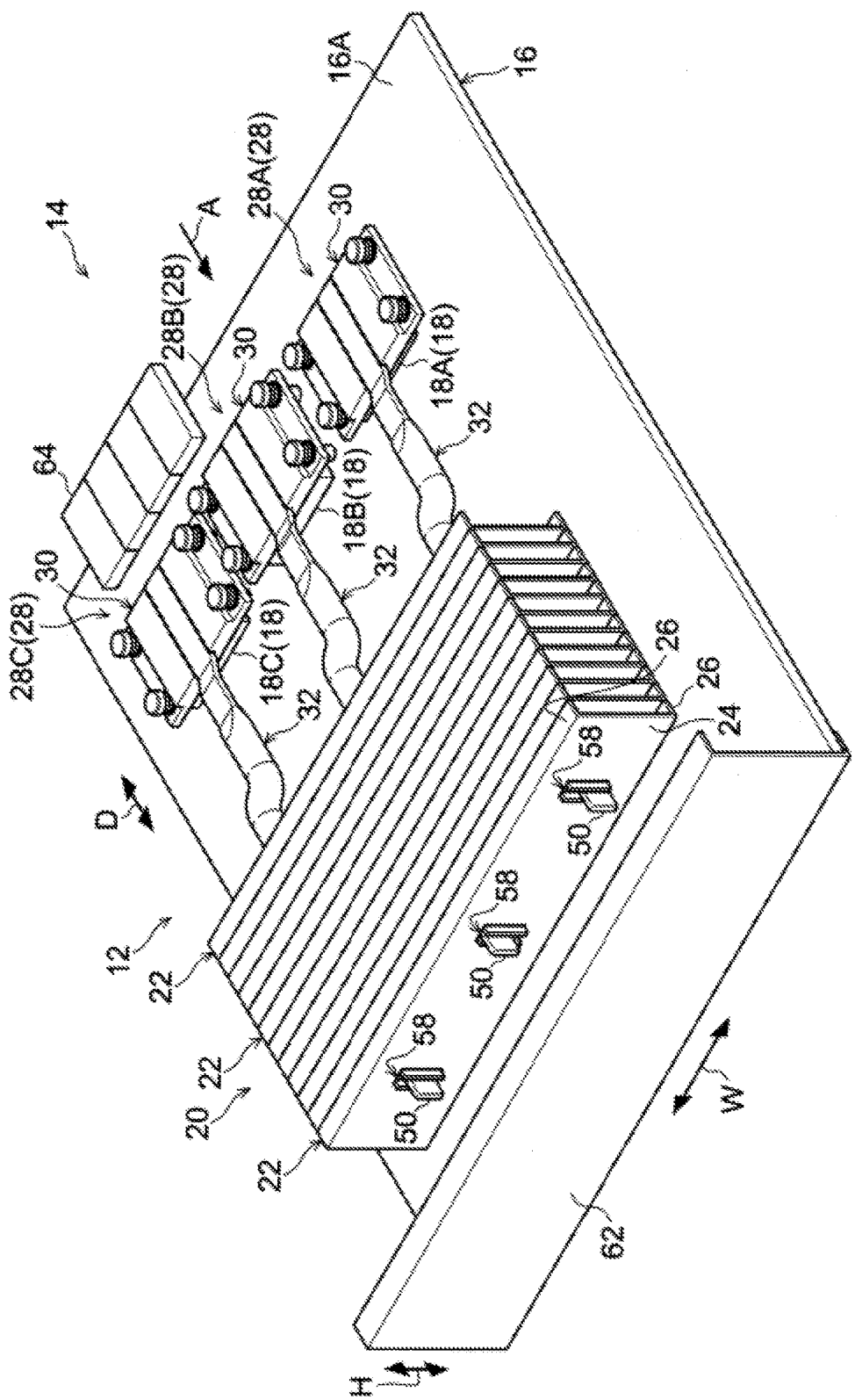
FIG. 1 is a perspective view illustrating a substrate unit including a heat dissipation device in a first embodiment.

FIG. 1 illustrates a substrate unit 14 including a heat dissipation device 12 in the first embodiment. The substrate unit 14 has a printed circuit board 16. As described later, the substrate unit 14 is mounted in a rack 68 of an electronic apparatus 66. In the example illustrated in FIG. 18, the substrate unit 14 is vertically mounted in the rack 68.

Hereinafter, as illustrated in FIG. 1, the width direction (the direction of arrow W), the depth direction (the direction of arrow D), and the height direction (the direction of arrow H) are defined with the printed circuit board 1 placed substantially horizontally. These directions are for the purpose of description and the state of use of the actual substrate unit 14 is not restricted by the directions. It is to be noted that the printed circuit board 16 is flat plate-shaped and the aforementioned height direction matches the normal direction to the printed circuit board 16.

A plurality (three in the example illustrated in FIG. 1) of electronic components 18A, 18B, 18C is mounted on an upper surface 16A of the printed circuit board 16. Hereinafter, when electronic components are not particularly distinguished, description is given by referring to an electronic component 18.

In the present embodiment, the positions of the upper surfaces of the electronic components 18A, 18B, and 18C have a vertical difference. In the example illustrated in FIG. 3, the electronic components 18A of the left side is the lowest and the electronic components 18C in the center is the highest. Such a vertical difference between the electronic components 18A, 18B, and 18C occurs because, for instance, the electronic components 18 are different types of electronic components. Or even with the same type of electronic components, the aforementioned vertical interval may occur due to a variation in the shape of individual components or a variation in the installation height with respect to the printed circuit board 16.

As illustrated in FIG. 1, on the printed circuit board 16, a heat sink 20 is mounted on an area where the electronic components 18 are not mounted. In the first embodiment, the heat sink 20 has a plurality of radiating fins 22. Each of the radiating fin 22 has a rectangular fin main body 24 and flanges 26 that extend perpendicularly from both ends of the fin main body 24 in the height direction (the direction of arrow H). The radiating fins 22 are vertically located on the printed circuit board 16 so that fin main bodies 24 are aligned in parallel at regular intervals in the depth direction (the direction of arrow D). The ends of the flanges 26 are in contact with the adjacent fin main bodies 24, and thereby the intervals between the fin main bodies 24 are maintained at a certain level.

The heat dissipation device 12 has heat transfer members 28A, 28B, 28C that correspond to the electronic components 18A, 18B, and 18C, respectively. Hereinafter, when transfer members are not particularly distinguished, description is given by referring to a heat transfer member 28.

Figure 7:
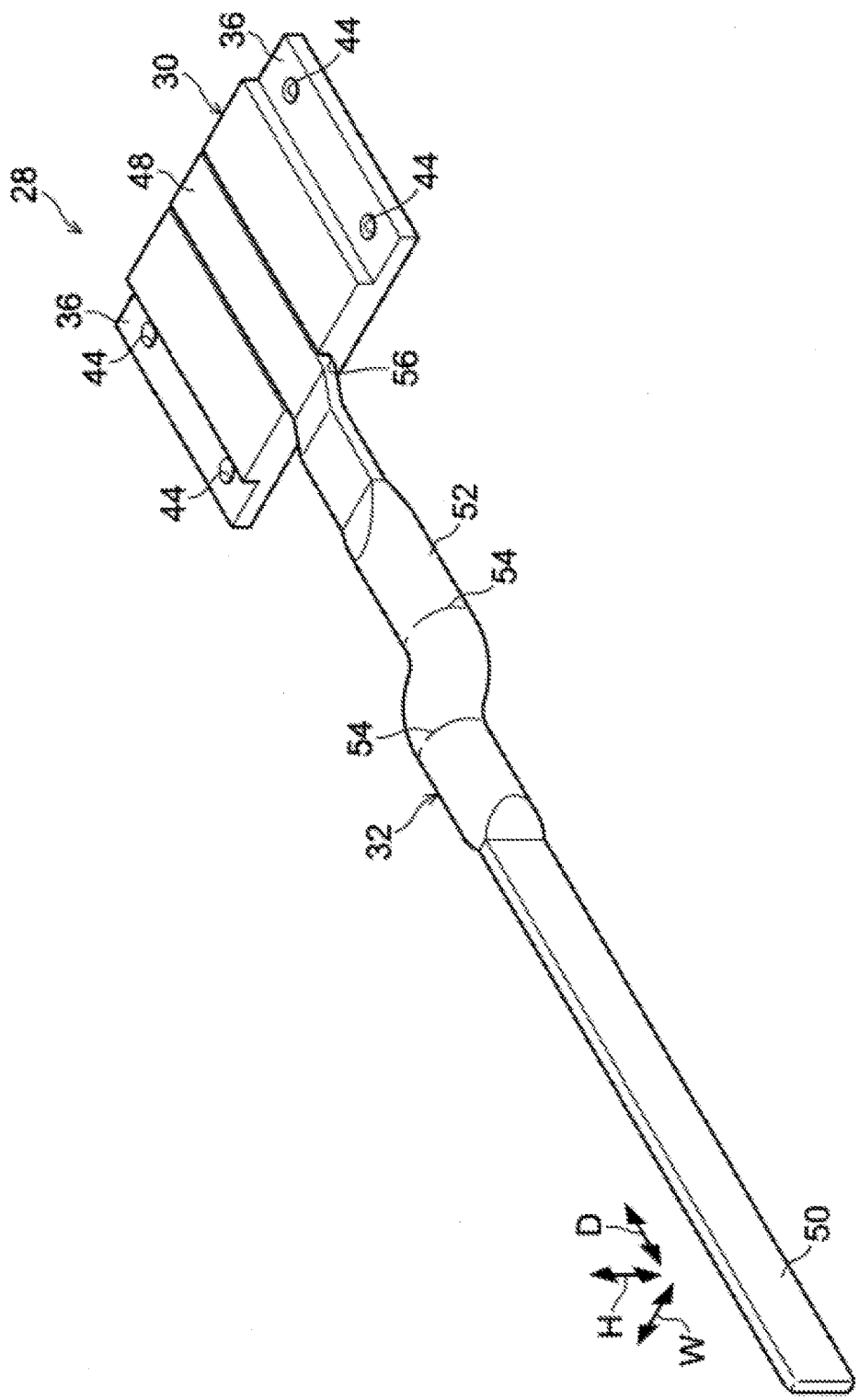
FIG. 7 is a perspective view illustrating a heat transfer member in the first embodiment.

As illustrated in FIG. 7, the heat transfer member 28 has a heat receiving member 30 and a heat pipe 32 bonded to the heat receiving member 30.

The heat receiving member 30 is composed of a material having high thermal conductivity and stiffness, such as metal, and is plate-shaped in the present embodiment. As also illustrated in FIGS. 3 to 6, the heat receiving member 30 receives the heat of the electronic component 18 by being disposed to be opposed to or in contact with the upper surface of the electronic component 18. In the present embodiment, a heat transfer sheet 34 is interposed between the upper surface of the electronic component 18 and the lower surface of the heat receiving member 30. The heat transfer sheet 34 is a film-shaped member having thermal conductivity and elasticity.

The heat receiving member 30 has a projection portion 36 that projects more than the electronic component 18 in the width direction (the direction of arrow W). In the projection portion 36, screw holes 44 are formed through each of which a screw 38 (see FIGS. 3 to 6) is inserted. In the printed circuit board 16 also, screw holes (not illustrated) are formed through each of which a screw 38 is inserted.

In addition, warpage protection metal fixtures 40 corresponding to the respective heat receiving members 30 are disposed on the lower surface side of the printed circuit board 16. A female screw (not illustrated) corresponding to the screw 38 is formed in each warpage protection metal fixture 40.

The screw 38 is inserted in each of the screw holes 44 of the projection portion 36 and the screw holes 44 of the printed circuit board 16, and the screw 38 is screwed in a female screw 42 of the warpage protection metal fixture 40. Thus, the heat receiving member 30 is fixed to the printed circuit board 16 with the electronic component 18 and the heat transfer sheet 34 interposed between the printed circuit boards 16 and the heat receiving member 30.

Each screw 38 is equipped with a coil spring 46. Application of elastic force of coil spring 46 to the heat receiving member 30 allows the heat receiving member 30 to be strongly pressed to the printed circuit board 16.

Figure 8:
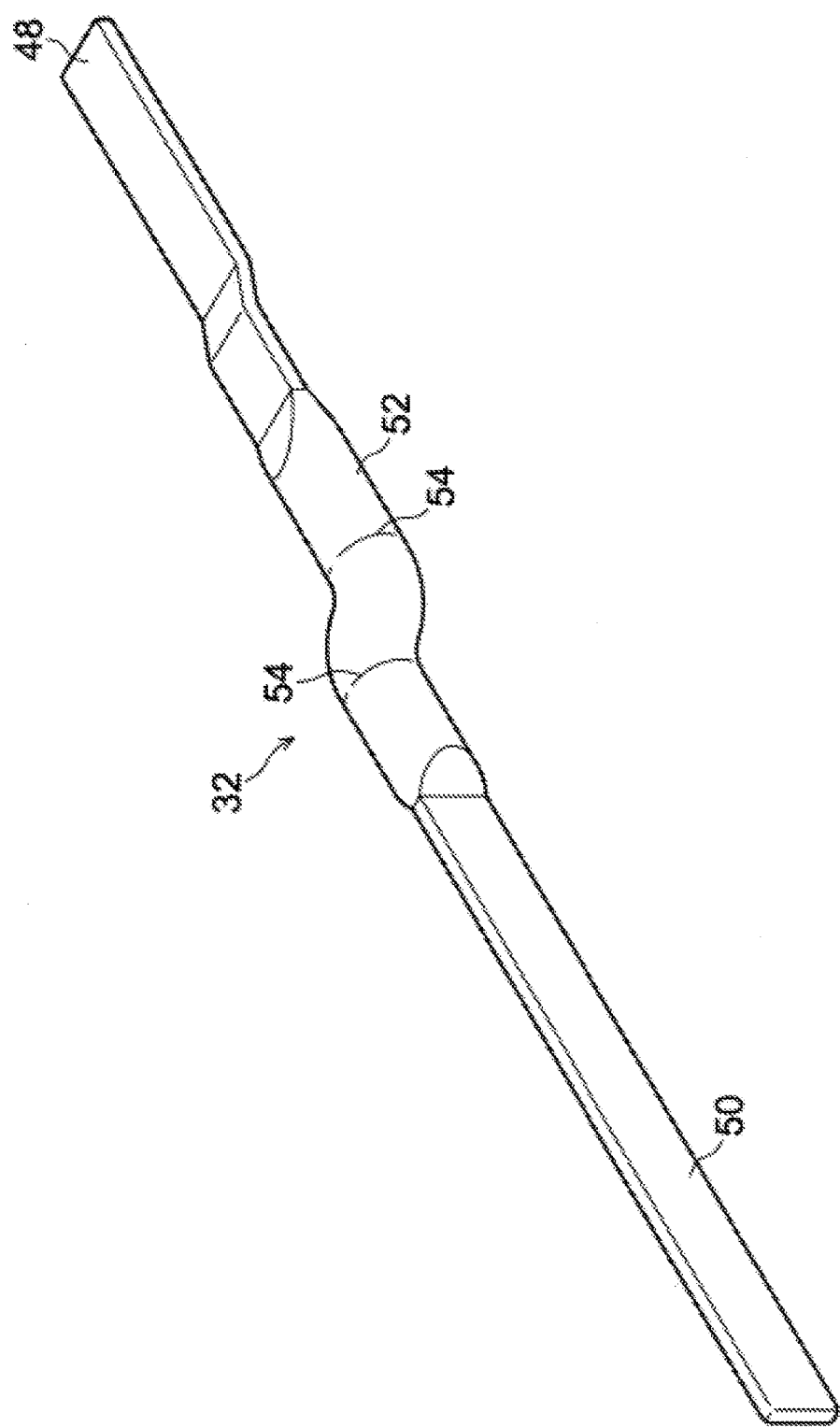
FIG. 8 is a perspective view illustrating a heat pipe in the first embodiment.

As illustrated in FIG. 8, the heat pipe 32 is generally rod-shaped and is a hollow member in which working fluid is sealed.

One end side of the heat pipe 32 is a first flat portion 48 that is long in the height direction (the direction of arrow H). The other end side of the heat pipe 32 is a second flat portion 50 that is long in the width direction (the direction of arrow W). An intermediate portion 52 is located between the first flat portion 48 and the second flat portion 50, the intermediate portion 52 having a circular cross-section perpendicular to the longitudinal direction. Two bent portions 54 are formed in the intermediate portion 52, and the second flat portion 50 is parallel to the first flat portion 48 and is in a position (higher position) away from the printed circuit board 16.

A housing groove 56 is formed in the upper surface of the heat receiving member 30. With part of the first flat portion 48 of the heat pipe 32 housed in the housing groove 56, the heat pipe 32 and the heat receiving member 30 are fixed to each other by swaging, soldered joint, adhesion, or the like.

Figure 2:
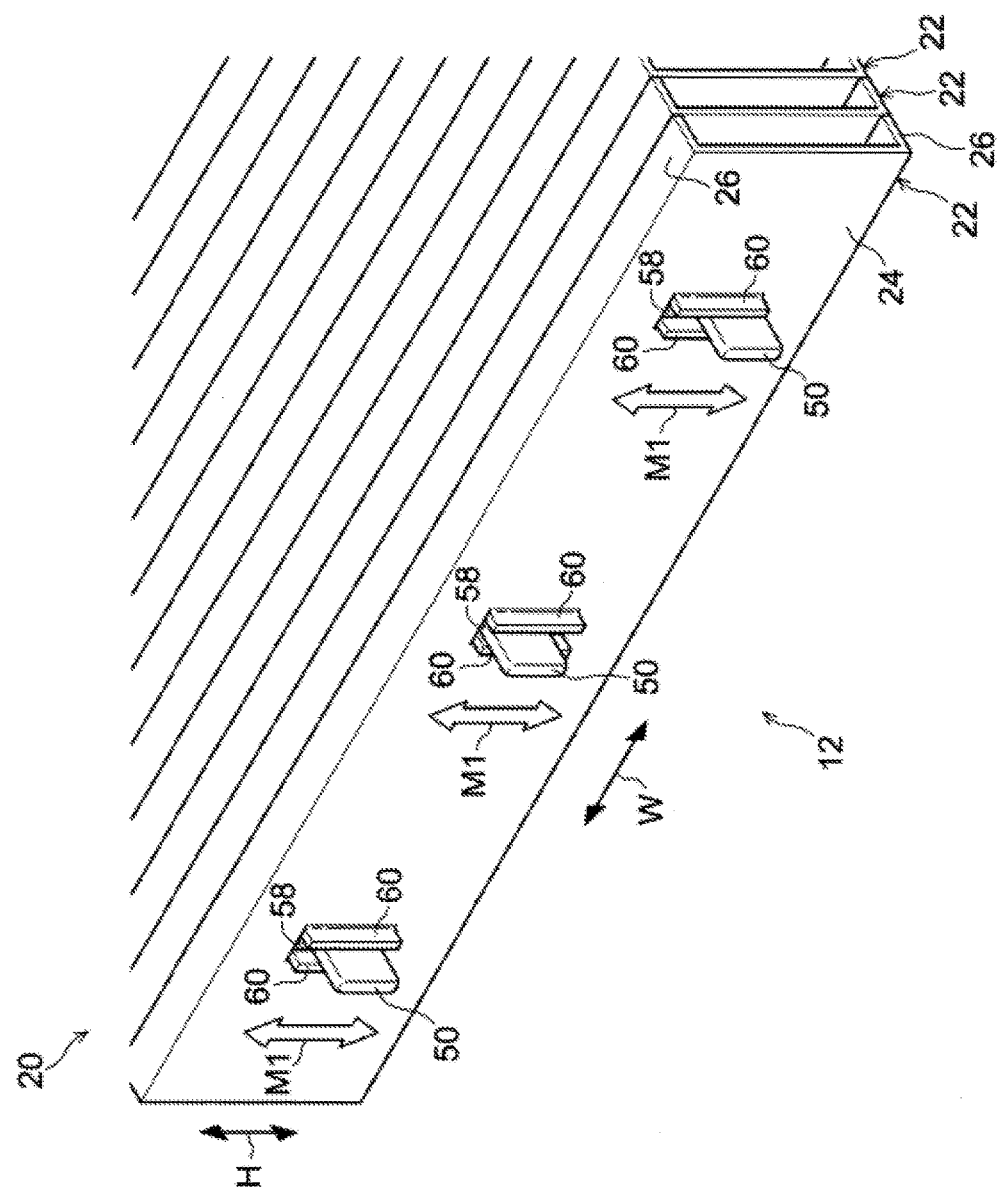
FIG. 2 is a partially enlarged perspective view of the heat dissipation device in the first embodiment.

As illustrated in FIG. 1 and FIG. 2, in each of the fin main bodies 24 of the radiating fins 22, a certain number of openings 58 are formed, the certain number equivalent to the number (three in the example illustrated in FIG. 1) of the heat transfer members 28 (heat pipes 32). The openings 58 penetrate through each of the fin main bodies 24 in the direction of plate thickness.

Figure 9:
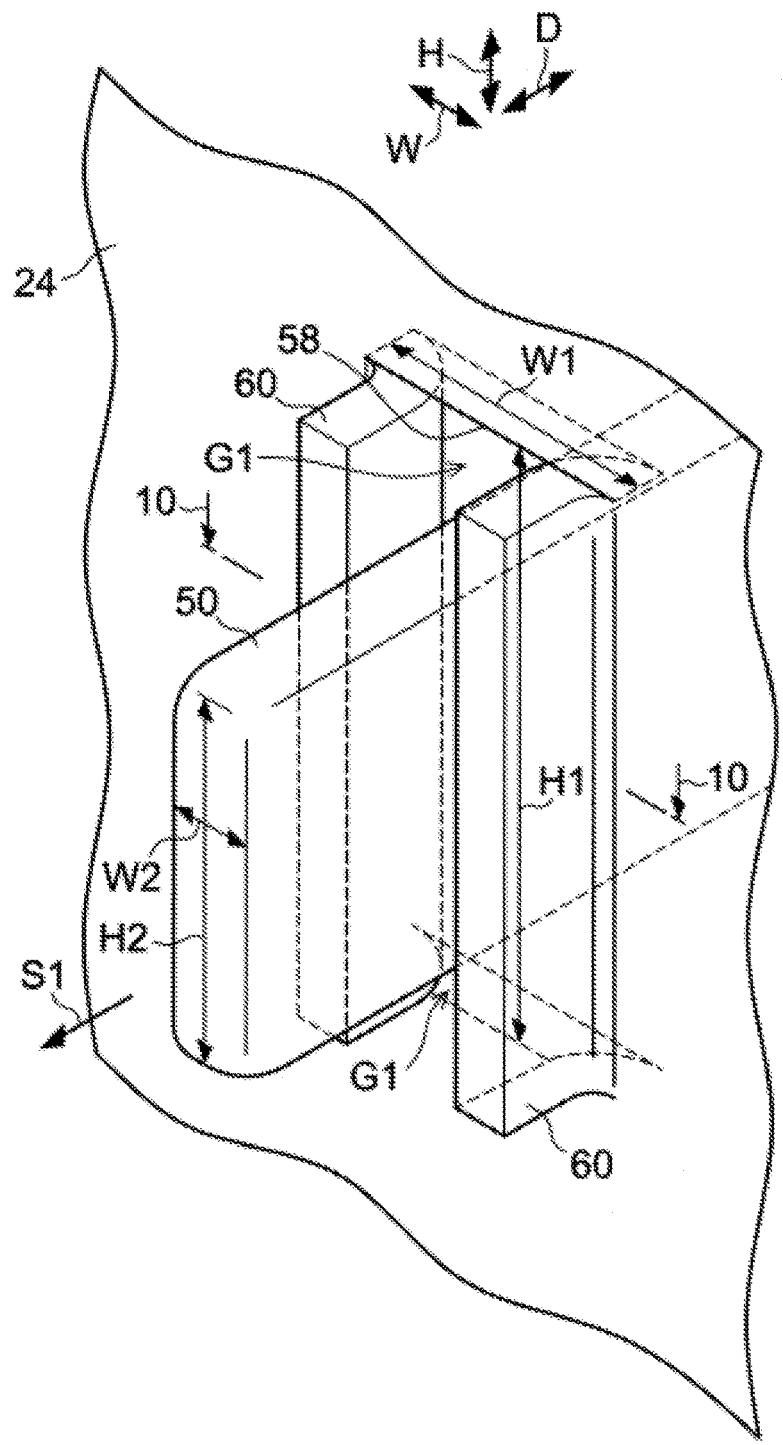
FIG. 9 is an enlarged perspective view illustrating the vicinity of an opening of a heat sink in the first embodiment along with the heat pipe.
Figure 11:
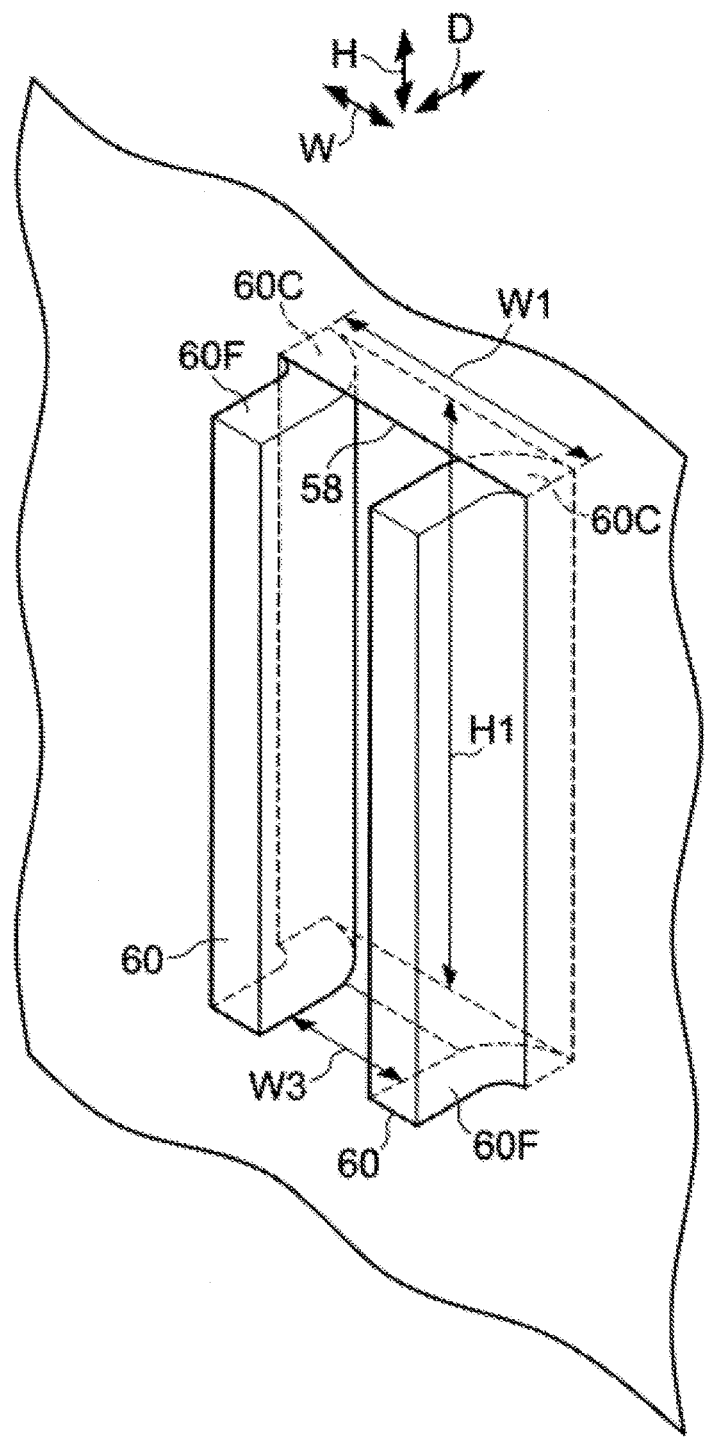
FIG. 11 is an enlarged perspective view illustrating the vicinity of the opening of the heat sink in the first embodiment.

As illustrated in FIG. 9 and FIG. 11 in detail, in the first embodiment, each opening 58 is rectangular as seen in the depth direction (the direction of arrow D). The height H1 of the internal dimension of the opening 58 is higher than the height H2 of the second flat portion 50 of the heat pipe 32. For instance, as illustrated in FIG. 9, when the second flat portion 50 of the heat pipe 32 is inserted into the vertical center of the opening 58, a vertical gap G1 is formed between the second flat portion 50 and the opening 58. Therefore, as indicated by arrow M1 in FIG. 2, with the second flat portion 50 inserted in the opening 58, the heat pipe 32 is movable relative to the heat sink 20 in a range of the gap G1 in the height direction (the direction of arrow H).

Figure 10:
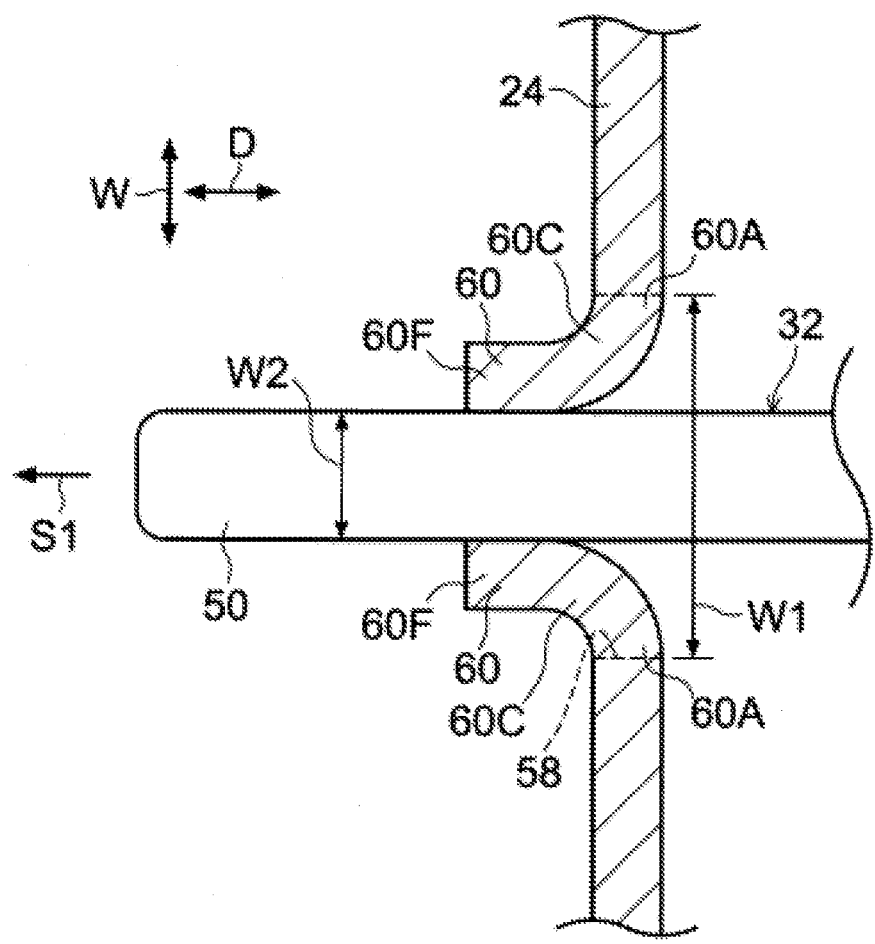
FIG. 10 is an enlarged sectional view illustrating the vicinity of the opening of the heat sink in the first embodiment along with the heat pipe, the sectional view taken along line 10-10 of FIG. 9.

As also illustrated in FIG. 10, width W1 of the opening 58 is wider than width W2 of the second flat portion 50 of the heat pipe 32.

A pair of spring plates 60 extends from the sides of the opening 58. In the present embodiment, the spring plates 60 are formed by deforming a portion of each fin main body 24 in the same direction (the direction of arrow S1) as the insertion direction of the heat pipe, the portion being left after cutting when the opening 58 is formed.

Specifically, each of the spring plates 60 has a curved portion 60C and a planar portion 60F. The curved portion 60C is located on the side of the fin main body 24 and is curved in the insertion direction (the direction of arrow S1) of the heat pipe 32 as is closer to the inner side of the opening 58. The planar portion 60F extends from the end side of the curved portion 60C in the direction of arrow S1. Each planar portion 60F is in surface contact with the second flat portion 50 of the inserted heat pipe.

As illustrated in FIG. 11, space W3 with the second flat portion 50 not inserted between the pair of spring plates 60 is narrower than the width W2 (see FIG. 9 and FIG. 10) of the second flat portion 50. With the second flat portion 50 inserted between the spring plates 60, the pair of spring plates 60 are in contact with the second flat portion 50 to nip the second flat portion 50 by elasticity. However, nipping force of the pair of spring plates 60 for the second flat portion 50 is set in a range to allow movement of the heat pipe 32 in the direction of arrow M1 (to cause resistance in the movement).

As illustrated in FIG. 1, the substrate unit 14 has a front panel 62 on the front side. As illustrated in FIG. 18, with the substrate unit 14 mounted in the rack 68 of the electronic apparatus 66, the front panel 62 is located on the front side to form the front face of the electronic apparatus 66. In particular, when a plurality of substrate units 14 are mounted in the rack 68, each front panel 62 is located on the same plane on the front side.

The substrate unit 14 has a connector 64 on the back side. The electronic apparatus 66 has a connection substrate 70 on the back side in the rack 68. The connection substrate 70 is located with a connector (not illustrated) connected to the connector 64 for each substrate unit 14. When the substrate unit 14 is inserted into a predetermined position in the rack 68, the connector 64 of the substrate unit 14 is electrically connected to a corresponding connector of the connection substrate 70.

Fans 72 are located in the rack 68 of the electronic apparatus 66. An air flow is generated in the rack 68 by driving the fans 72. The air flow then cools the heat sink 20.

Next, the operation of the heat dissipation device 12 and a method of dissipating heat in the present embodiment will be described.

The heat of the electronic components 18A, 18B, 18C mounted on the upper surface of the printed circuit board 16 is transferred to the heat receiving members 30 corresponding to the electronic components 18A, 18B, 8C through the heat transfer sheet 34. The heat of each heat receiving member 30 is moved by a heat pipe 32. Since the second flat portion 50 of the heat pipe 32 are in contact with the corresponding spring plates 60 of the radiating fins 22, the heat of the heat pipe 32 is transferred to the heat sink 20 (radiating fins 22). The air flow generated by the fans 72 strikes the heat sink 20 and the heat sink is cooled. In other words, the heat of the electronic components 18 may be transferred to the heat sink 20 in common by a heat receiving member 30 and a heat pipe 32 located corresponding to each of the electronic components 18, and then the heat may be dissipated.

As illustrated in FIGS. 3 to 6, in the present embodiment, in the electronic components 18A, 18B, 18C, a difference (vertical difference) occurs in the height from the upper surface 16A of the printed circuit board 16.

Here, as a comparative example, a heat dissipation device having a structure is discussed in which each heat pipe is fixed to the heat sink and the height of the heat pipe is not adjustable. Since the height of each heat pipe is not adjustable in the heat dissipation device in the comparative example, when a vertical difference occurs in the upper surface position of the electronic components, the respective heat receiving members integral with the heat pipes are made flush with the upper surface of an electronic component in the highest position.

However, when the heat pipes and the heat receiving members are located at a high position in this manner, a large gap occurs between, for instance, the upper surface of an electronic component in the lowest position and the heat receiving members, and thus heat resistance increases. Even with a structure in which a heat transfer sheet is interposed between the upper surface of each electronic component and the lower surface of each heat receiving member, heat resistance increases as the thickness of the heat transfer sheet increases.

On the other hand, with the heat dissipation device 12 in the present embodiment, as illustrated in FIG. 9, an internal dimension height H1 of the opening 58 formed in a radiating fin 22 of the heat sink 20 is higher than height H2 of the second flat portion 50 (inserted portion to the opening 58) of the heat pipe 32. Therefore, the heat pipe 32 is vertically movable within a range of a gap in the height direction between the opening 58 and the second flat portion 50. Since the heat receiving member 30 and the heat pipe 32 are fixed to each other, the heat receiving member 30 is also vertically movable relative to the heat sink 20 in each heat transfer member 28.

Thus even with a vertical difference in the upper surface positions of the electronic components 18A, 18B, 18C, adjusting the heights (vertical positions) of the heat pipe 32 and the heat receiving member 30 in this manner allows the space between the upper surface of each of the electronic components 18A, 18B, 18C and the lower surface of the corresponding heat receiving member 30 to be nearly uniform.

In particular, in each of the heat transfer members 28A, 28B, 28C, the heat receiving member 30 is positioned close to a corresponding one of the electronic components 18A, 18B, 18C, thereby making it possible to reduce the heat resistance over a route from the electronic components 18A, 18B, 18C to the heat receiving members 30.

Figure 3:
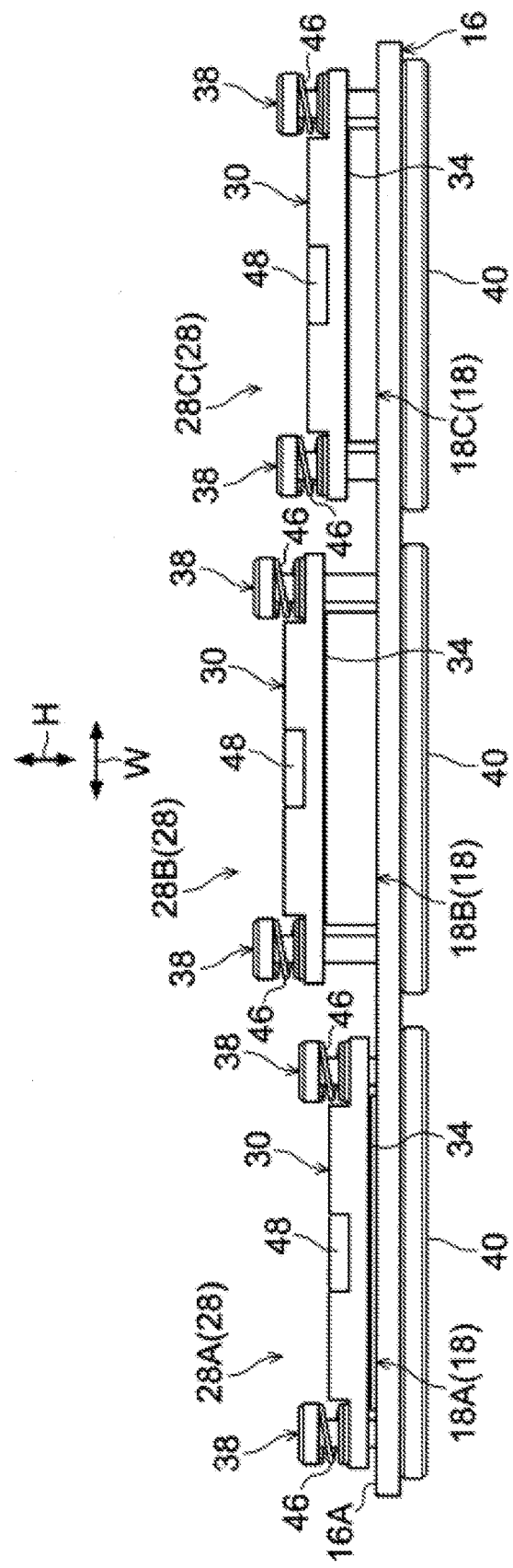
FIG. 3 is a view of the substrate unit including the heat dissipation device in the first embodiment, the view seen in the direction of arrow A of FIG. 1.
Figure 4:
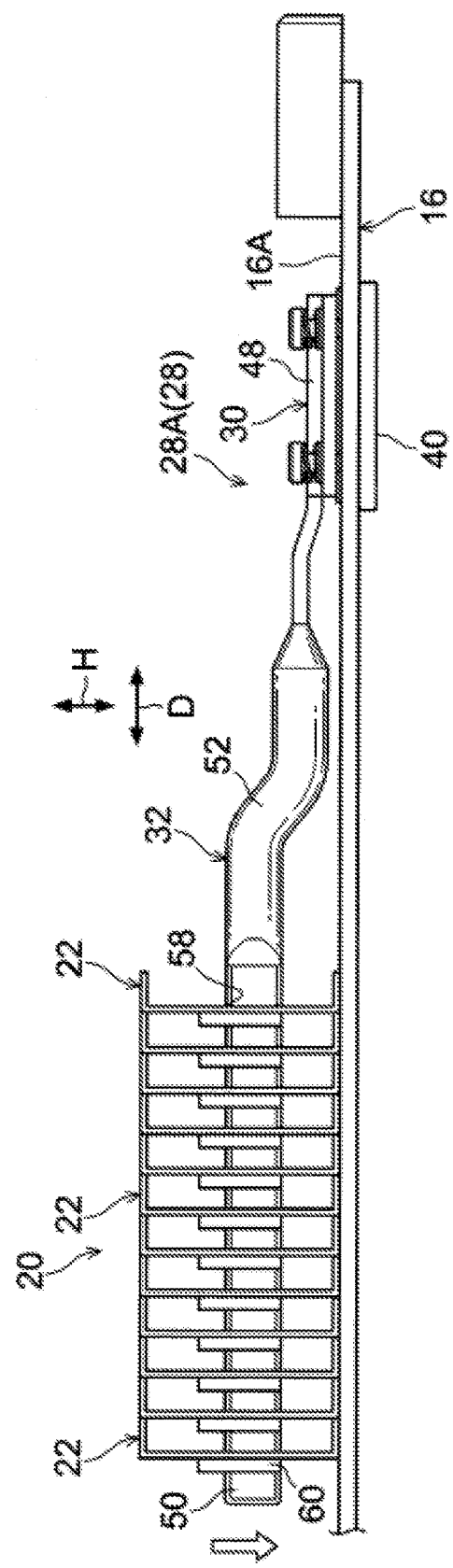
FIG. 4 is a side view partially illustrating the substrate unit including the heat dissipation device in the first embodiment.

Specifically, the height of the electronic component 18A on the left side of FIG. 3 is low. Therefore, as illustrated in FIG. 4, corresponding heat receiving member 30 and heat pipe 32 are lowered.

Figure 5:
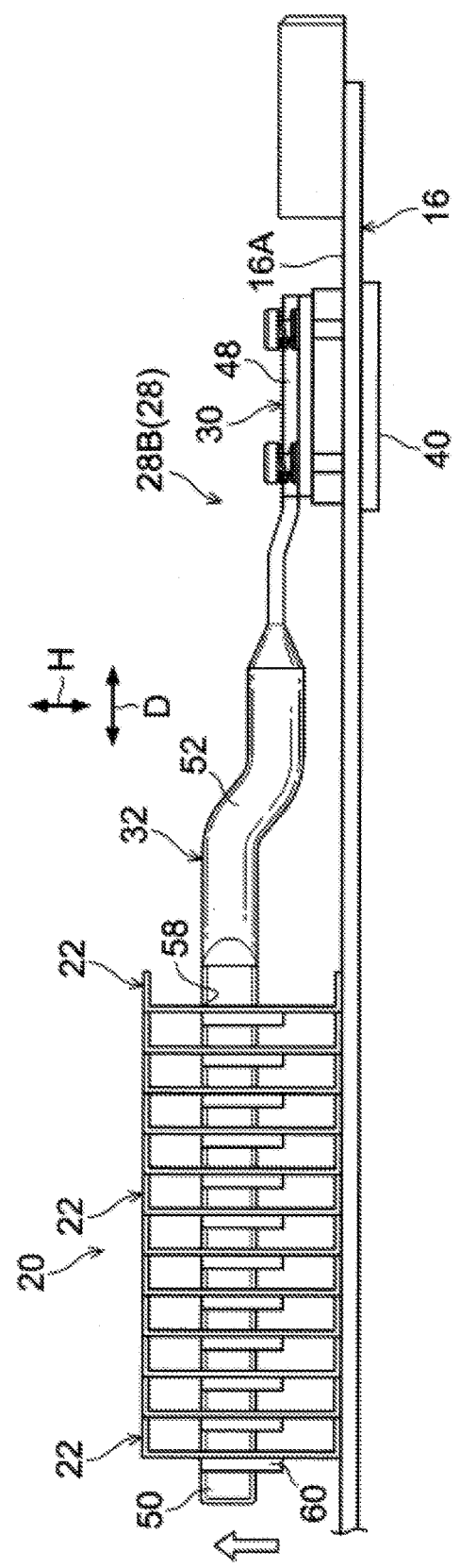
FIG. 5 is a side view partially illustrating the substrate unit including the heat dissipation device in the first embodiment.

On the other hand, the height of the central electronic component 18B of FIG. 3 is high. Therefore, as illustrated in FIG. 5, corresponding heat receiving member 30 and heat pipe 32 are raised.

Figure 6:
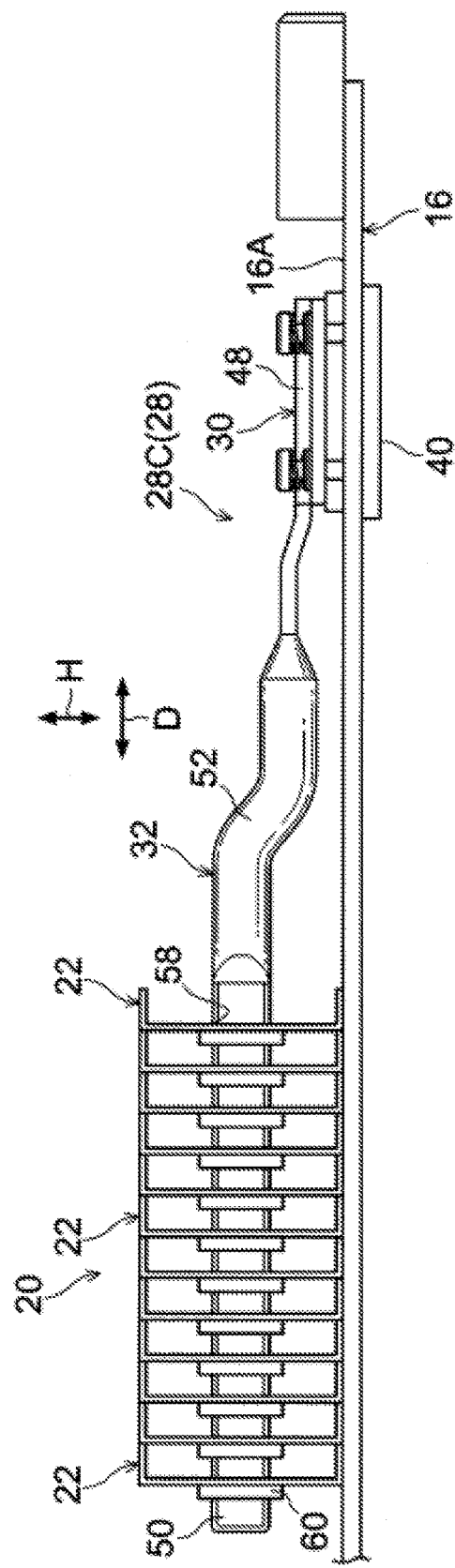
FIG. 6 is a side view partially illustrating the substrate unit including the heat dissipation device in the first embodiment.

The height of the electronic component 18C on the right side of FIG. 3 is intermediate between the height of the electronic component 18A and the height of the electronic component 18B. Therefore, as illustrated in FIG. 6, corresponding heat receiving member 30 and heat pipe 32 have also intermediate heights.

Thus, for instance, the thickness of the heat transfer sheet 34 may be made to be approximately 1 mm between any of the electronic components 18A, 18B, 18C and the corresponding heat receiving member 30. In this manner, thinning the heat transfer sheet 34 reduces the heat resistance due to the heat transfer sheet itself compared with a structure in which the heat transfer sheet is thick.

In a structure in which each heat pipe 32 is fixed to the heat sink 20, there is a possibility that significant stress may be applied to the fixed portion. In order to avoid damage due to the stress applied to the fixed portion, a structure for firmly fixing is desired. On the other hand, in the present embodiment, the heat pipe 32 is movable relative to the heat sink 20 and is not fixed to the heat sink 20, and thus possibility of damage due to the aforementioned stress is small.

Thus, for instance, the thickness of the heat transfer sheet 34 may be made to be approximately 1 mm between any of the electronic components 18A, 18B, 18C and the corresponding heat receiving member 30. In this manner, thinning the heat transfer sheet 34 reduces the heat resistance due to the heat transfer sheet itself compared with a structure in which the heat transfer sheet is thick.

Since the heat sink 20 (radiating fins 22) has the spring plates 60 in the first embodiment, the heat of each heat pipe 32 is transferred to the spring plates 60 and further to the heat sink 20. However, it is to be noted that for instance, by setting the width of the opening 58 to a width that allows direct contact with the second flat portion 50 of the heat pipe 32 without locating the spring plates 60, it is possible to transfer the heat of the heat pipe 32 to the heat sink 20. Also, when there is the gap G1 (see FIG. 9) between the opening 58 and the second flat portion 50, the vertical position of the heat pipe 32 relative to the heat sink 20 is adjustable. With the structure having the spring plates 60 as in the present embodiment, the heat pipes 32 are maintained by the elasticity of the spring plates 60, and thus positional displacement of the heat pipe 32 relative to the heat sink 20 may be reduced.

In particular, since the spring plates 60 as an example of the heat transfer member are formed integrally with the heat sink 20, the number of components is smaller compared with a structure with separate components. Since the spring plates 60 are formed integrally with the heat sink 20, work of mounting a heat transfer member on the heat sink 20 is also unnecessary.

In addition, since a heat pipe 32 is inserted between a pair of spring plates 60, the heat pipe 32 may be held by nipping between the spring plates 60. Since the heat pipe 32 is held by the elasticity of the spring plates 60, a contact state between the heat pipe 32 and the spring plates 60 may be stably maintained.

In the first embodiment, the second flat portion 50 (inserted portion to the opening 58) of the heat pipe 32 has a vertically long flat shape. The planar portion 60F of each spring plate 60 is in surface contact with the second flat portion 50. Therefore, the contact surface between the spring plate 60 and the heat pipe 32 is large compared with a structure in which neither the planar portion 60F nor the second flat portion 50 is formed. Consequently, efficient heat transfer from the heat pipe 32 to the heat sink 20 is possible.

In the first embodiment, the spring plates 60 are made to come into contact with the second flat portion 50 in a lateral direction. Since the second flat portion 50 is not nipped by the spring plates 60 in the height direction, the effect on the vertical movement of the heat pipe 32 relative to the heat sink 20 is small.

Each spring plate 60 extends diagonally from the fin main body 24 in the insertion direction (the direction of arrow S1 illustrated in FIG. 9 and FIG. 10) of the heat pipe 32, and the ends of the spring plates 60 are close to each other. Since the curved portion 60C of the spring plate 60 spreads out more than the planar portion 60F, when the heat pipe 32 is inserted into the opening 58 in the direction of arrow S1, insertion opening is wide and insertion is easy. Also, when the opening 58 is seen from the insertion side (the right side of FIG. 10) of the heat pipe 32, the range of insertion of the heat pipe 32 gradually narrows in the insertion direction due to the curved portion 60C. For this reason, the heat pipe 32, when inserted into the opening 58, is guided to the widthwise center along the curved portion 60C.

Next, a second embodiment will be described. In the second embodiment, the same elements, members as in the first embodiment are denoted by the same symbols, and detailed description is omitted. Also, in the second embodiment, the general structure of the heat dissipation device is the same as in the first embodiment, and thus illustration thereof is omitted.

Figure 12:
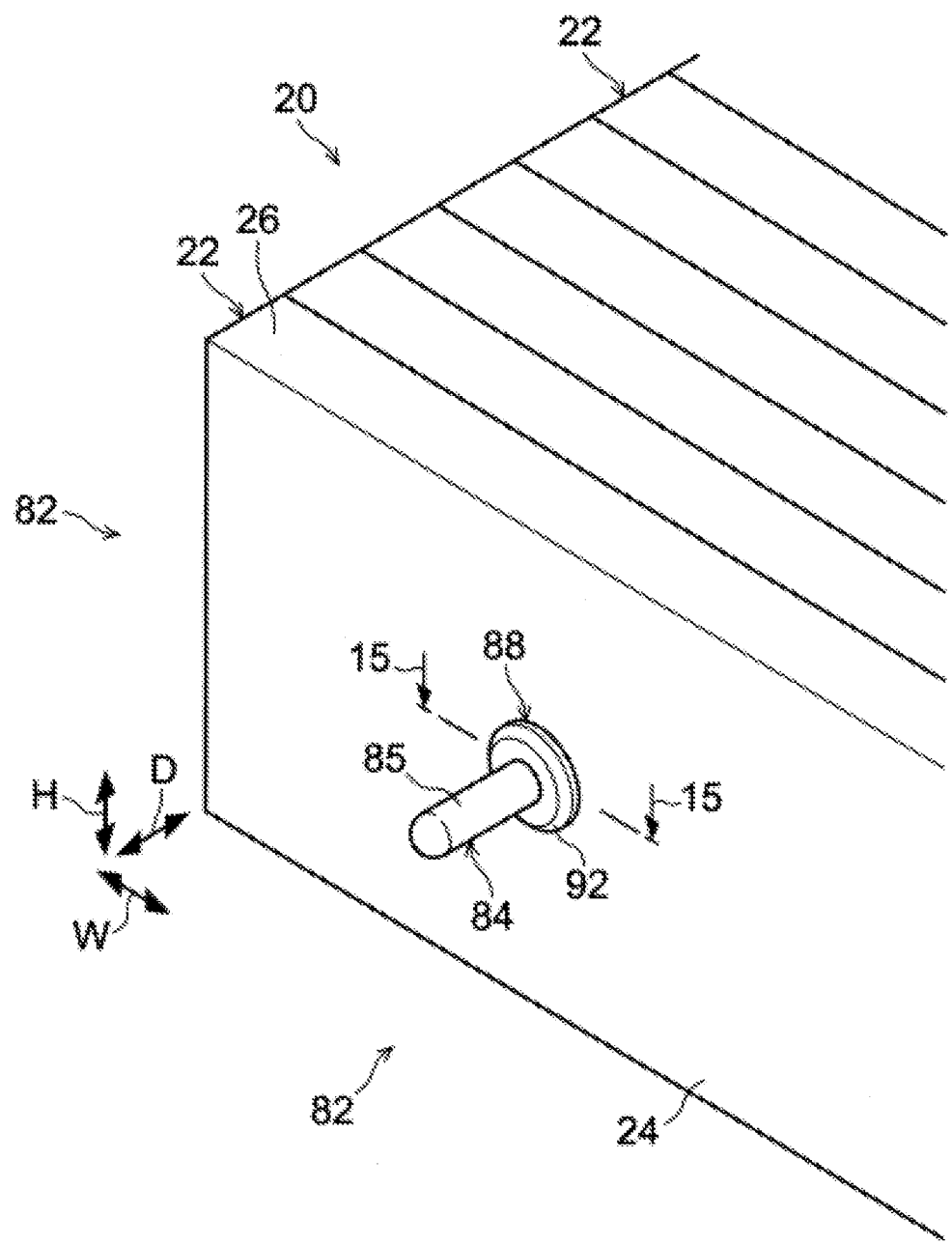
FIG. 12 is an enlarged perspective view illustrating the vicinity of an opening of a heat sink in a second embodiment along with the heat pipe and a bush.
Figure 13:
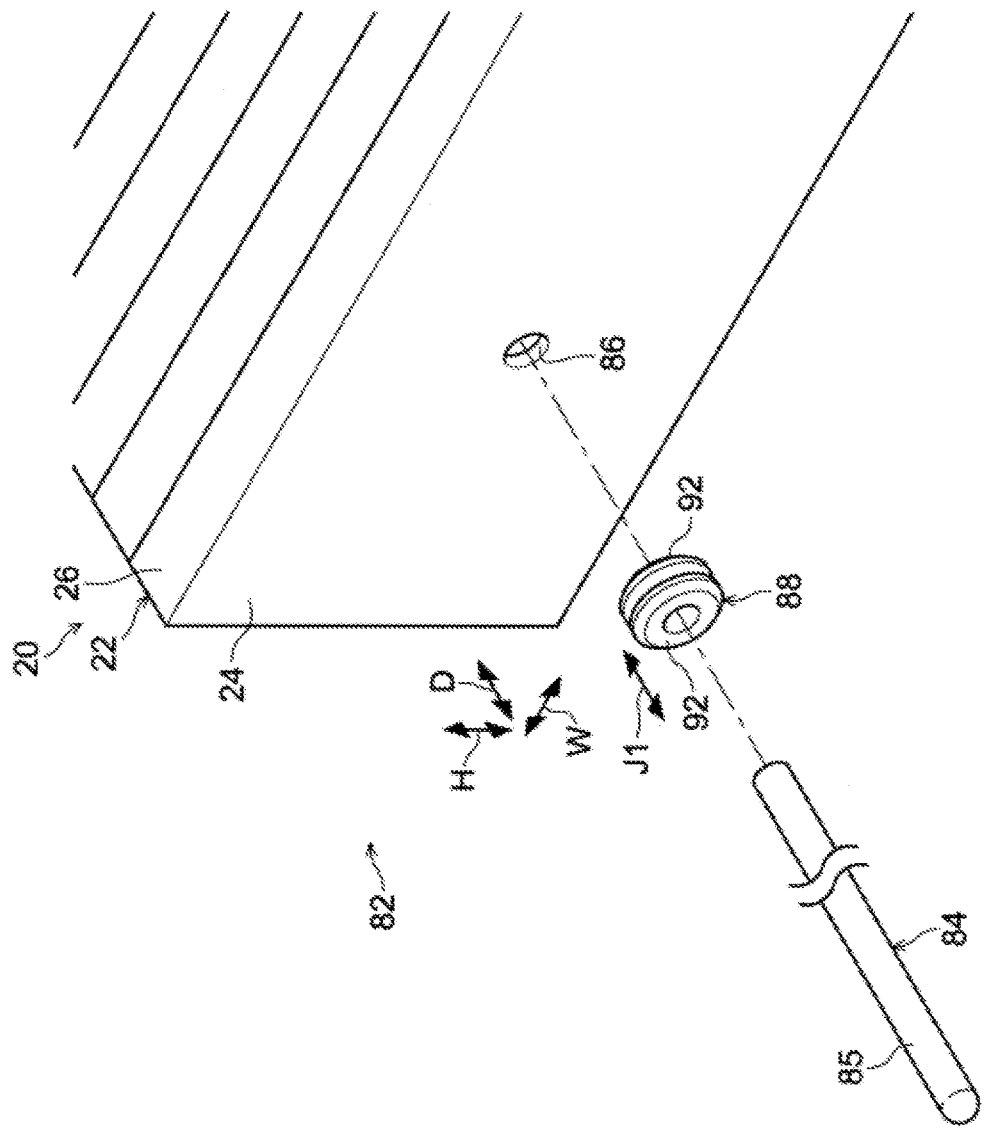
FIG. 13 is an enlarged exploded perspective view illustrating the vicinity of the opening of the heat sink in the second embodiment along with the heat pipe and the bush.

As illustrated in FIG. 12 and FIG. 13, in a heat dissipation device 82 in the second embodiment, the other end side of a heat pipe 84 has a cylindrical shape. In other words, the appearance of the other end side of the heat pipe 84 is a circular portion 85 with diameter D1 as viewed in a cross-section with a normal line in the longitudinal direction.

Also, in the second embodiment, the openings 86 formed in the fin main bodies 24 of the radiating fins 22 of the heat sink 20 are circular. The internal diameter D2 of the opening 86 is greater than the diameter D1 of the other end side of the heat pipe 84.

The opening 86 is equipped with a bush 88. The bush 88 is formed in a generally circular shape using a material (for instance, heat conductive rubber) having thermal conductivity and elasticity.

Figure 14:
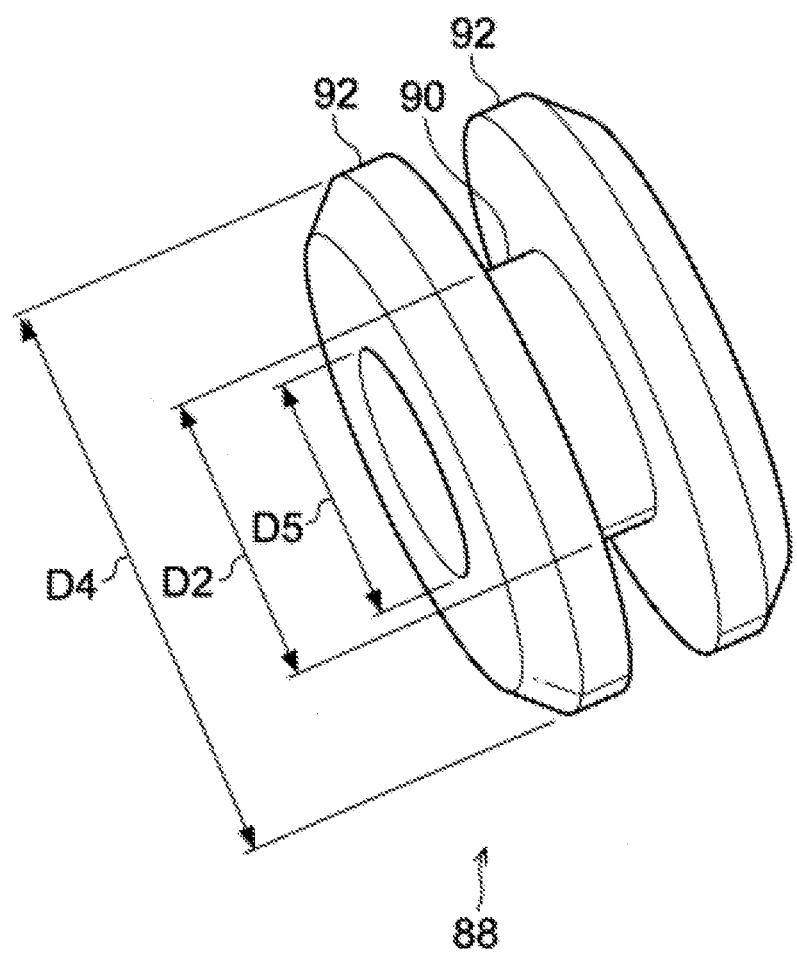
FIG. 14 is a perspective view illustrating the bush in the second embodiment.
Figure 15:
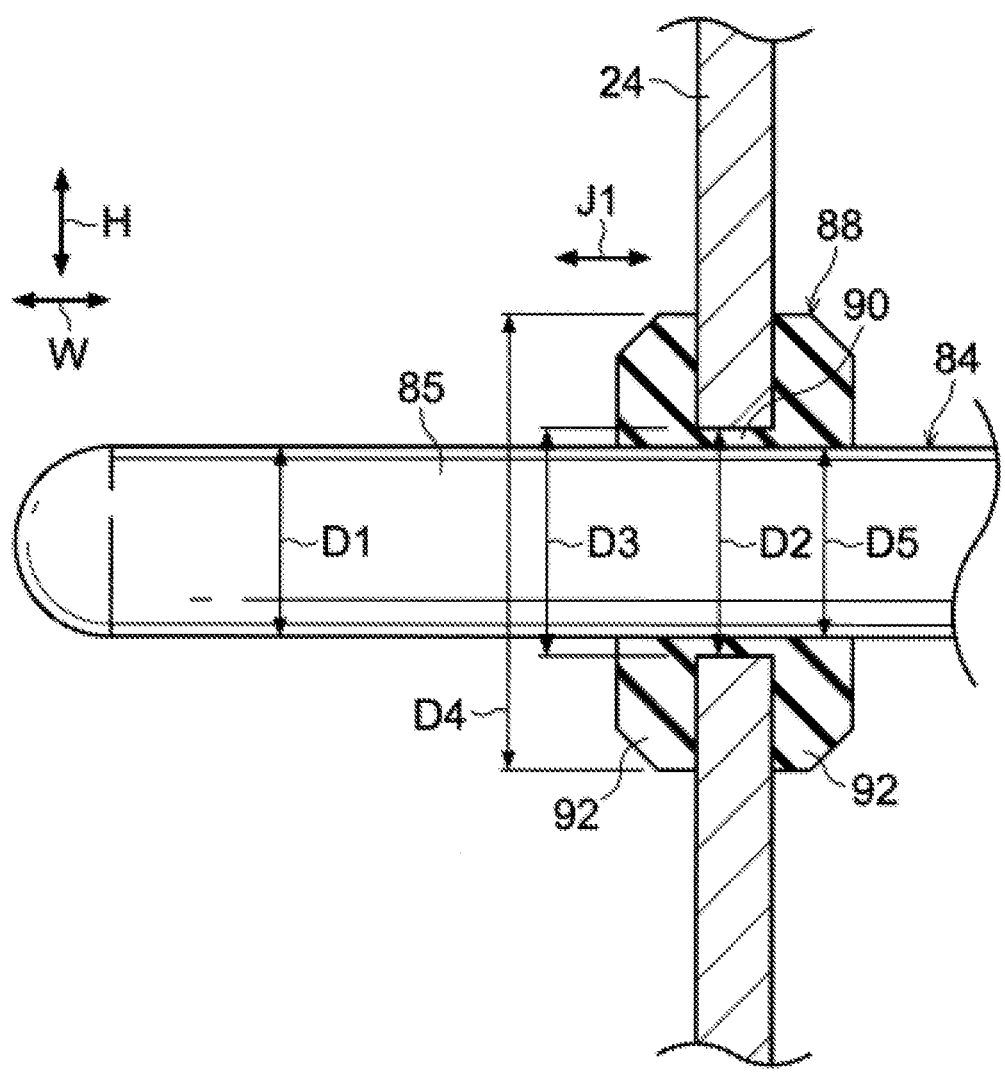
FIG. 15 is an enlarged sectional view illustrating the vicinity of the opening of the heat sink in the second embodiment along with the heat pipe and the bush, the sectional view taken along line 15-15 of FIG. 12.

As illustrated in FIG. 14 and FIG. 15 in detail, the bush 88 has a minor diameter portion 90 at the center in the axial direction (the direction of arrow 31) and two major diameter portions 92 on both sides in the axial direction.

As illustrated in FIG. 15, external diameter D3 of the minor diameter portion 90 is comparable to or slightly greater than the internal diameter D2 of the opening 86.

On the other hand, the major diameter portion 92 has external diameter D4 greater than the internal diameter D2 of the opening 86. The internal diameter D5 of the major diameter portions 92 and the minor diameter portion 90 is smaller than the diameter D1 of the other end side of the heat pipe 84.

One of the major diameter portions 92 is inserted through the opening 86 while being compressed and deformed due to the elasticity of the bush 88, and the compression is released when the minor diameter portion 90 reaches the opening 86. Then the major diameter portions 92 come into contact with both sides of the fin main body 24. Then the bush 88 is held by and mounted on the radiating fin 22. In this state, the outer circumferential portion of the minor diameter portion 90 is in contact with the inner circumferential portion of the opening 86.

Also, with the bush 88 mounted on the radiating fin 22, opposed faces of the two major diameter portions 92 are in contact with the fin main body 24.

In this manner, in the second embodiment, the other end side of the heat pipe 84 is inserted in the inside of the bush 88 which is mounted on the radiating fin 22. Since the internal diameter D5 of the major diameter portions 92 and the minor diameter portion 90 is smaller than the diameter D1 of the other end side of the heat pipe 84, the inner surface of the bush 88 comes into intimate contact with the outer surface of the heat pipe 84. Consequently, the other end side of the heat pipe 84 is held by the heat sink 20 with inserted in the opening 86. In the second embodiment, the heat of the heat pipe 84 is transferred to the heat sink 20 through the bush 88.

Since the bush 88 has elasticity, the bush 88 is movable in the radial direction (the height direction, the width direction, and a combined direction of these directions) relative to the heat sink 20 with the other end side of the heat pipe 84 held by the bush 88. Even with a vertical difference in the upper surfaces of the electronic components 18A, 18B, 18C (see FIG. 1, FIGS. 3 to 6), vertical movement of the heat pipe 84 relative to the heat sink 20 allows the heights of the heat pipe 84 and the heat receiving member 30 to be adjusted and also allows the space between the upper surface of each of the electronic components 18A, 18B, 18C and the lower surface of the corresponding heat receiving member 30 to be nearly uniform. The heat receiving member 30 is positioned close to a corresponding one of the electronic components 18A, 18B, 18C, thereby making it possible to reduce the heat resistance over a route from the electronic components 18A, 18B, and 18C to the heat receiving members 30.

In the second embodiment, the bush 88 as an example of the heat transfer member is a separate component from the heat sink 20. Therefore, by changing the shape of the bush 88, a structure for heat transfer from the heat pipe 84 to the heat sink 20 may be easily implemented in a corresponding manner to various shapes of the heat pipe 84.

In the second embodiment, the shape of the opening 86 is circular and the cross-sectional shape of the other end side of the heat pipe 84 is also circular. The internal diameter D2 of the opening 86 is greater than the diameter D1 of the other end side (inserted portion to the opening 86) of the heat pipe 84. Consequently, positional displacement of the heat pipe 84 relative to the heat sink 20 may be accommodated in the height direction (the direction of arrow H), the width direction (the direction of arrow W), and a combined direction of these directions.

In the second embodiment, the bush 88 has a circular shape and surrounds the other end side of the heat pipe 84 by the entire circumference. Therefore, heat may be efficiently transferred from the heat pipe 84 to the heat sink 20.

In the second embodiment, the bush 88 is mounted on each of the openings 58 of each radiating fin 22 to transfer the heat of the heat pipe 32 to the radiating fin 22. Consequently, for instance, in contrast to a structure in which the bush 88 is mounted on only one radiating fin 2, the area for heat transfer from the heat pipe 32 to the radiating fin 22 is large, and thus efficient heat transfer is possible.

Next, a third embodiment will be described. Also in the third embodiment, the same elements, members as in the first embodiment or the second embodiment are denoted by the same symbols, and detailed description is omitted. Also, in the third embodiment, the general structure of the heat dissipation device is the same as in the first embodiment, and thus illustration thereof is omitted.

Figure 16:
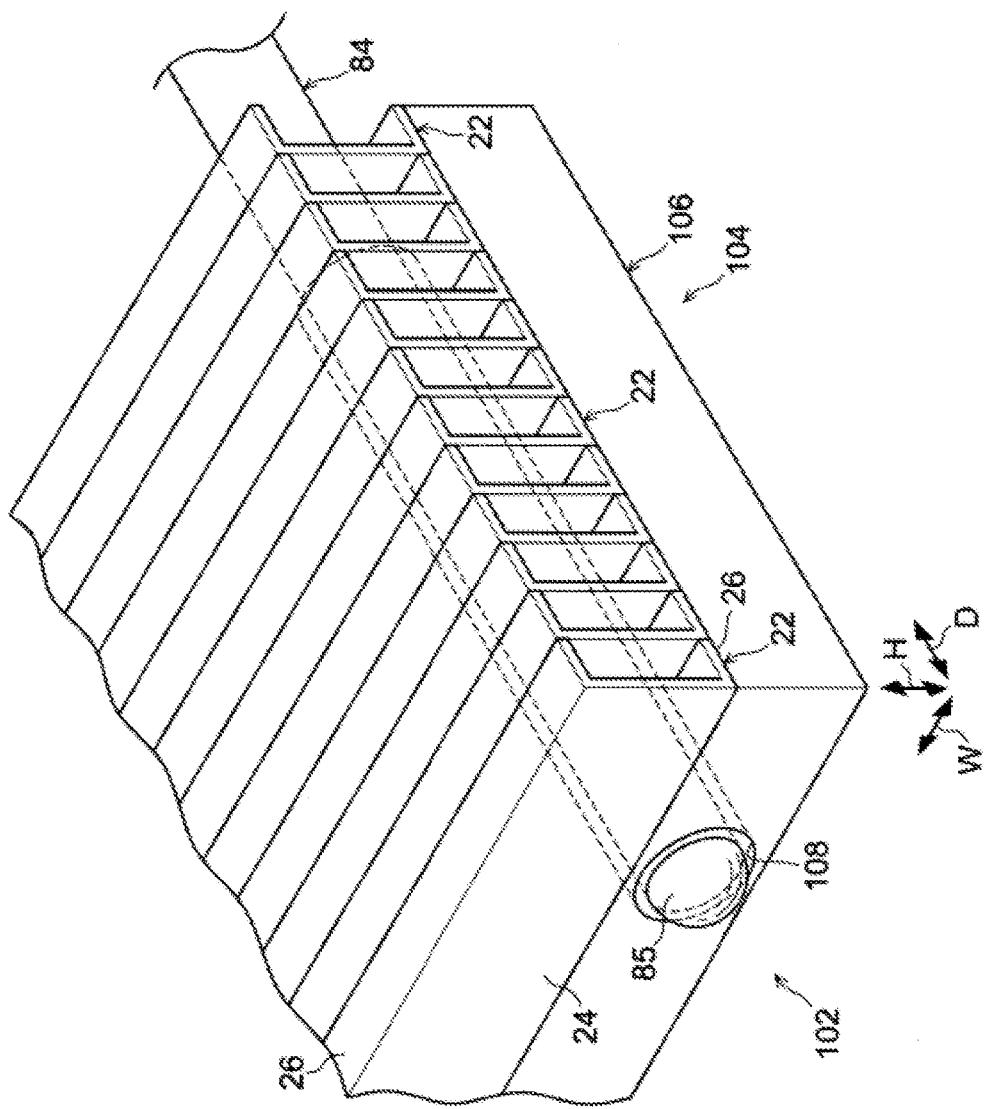
FIG. 16 is an enlarged perspective view illustrating the vicinity of an opening of a heat sink in a third embodiment.

As illustrated in FIG. 16, similarly to the second embodiment, a heat dissipation device 102 in the third embodiment has the heat pipe 84 having a circular cross-section on the other end side.

In the heat dissipation device 102 in the third embodiment, a heat sink 104 has the radiating fins 22 and a base member 106. The base member 106 is formed in a block shape of a rectangular prism using a material (for instance, the same material as that of the radiating fins 22) having thermal conductivity and stiffness.

In the base member 106, a through hole 108 is formed through which the other end side of the heat pipe 84 is inserted. The internal diameter of the through hole 108 is greater than the external diameter of the other end side of the heat pipe 84.

A tube 110 is disposed between the through hole 108 and the other end side of the heat pipe 84. The tube 110 is formed in a cylindrical shape using a material having thermal conductivity and elasticity. The external diameter of the tube 110 is slightly greater than the internal diameter of the through hole 108, and the internal diameter of the tube 110 is slightly smaller than the external diameter of the other end side of the heat pipe 84.

The tube 110 may be housed in the through hole 108 in advance then the other end side of the heat pipe 84 may be inserted in the tube 110, or the tube 110 may be mounted on the other end side of the heat pipe 84 then the heat pipe 84 may be inserted in the through hole 108.

In the third embodiment, since the tube 110 is present between the heat pipe 84 and the heat sink 104 (the base member 106), the heat of the heat pipe 84 may be transferred to the base member 106 through the tube 110. In addition, the heat moves from the base member 106 to the radiating fins 22 to radiate.

Since the tube 110 has elasticity, the tube 110 is movable in the radial direction (the height direction, the width direction, and a combined direction of these directions) relative to the heat sink 20 with the other end side of the heat pipe 84 held by the bush 88. Even with a vertical difference in the upper surfaces of the electronic components 18A, 18B, 18C (see FIG. 1, FIGS. 3 to 6), it is possible to adjust the heights of the heat pipe 84 and the heat receiving member 30 and to set nearly uniform space between the upper surface of each of the electronic components 18A, 18B, 18C and the lower surface of the corresponding heat receiving member 30. The heat receiving member 30 is positioned close to a corresponding one of the electronic components 18A, 18B, 18C, thereby making it possible to reduce the heat resistance over a route from the electronic components 18A, 18B, and 18C to the heat receiving members 30.

In the third embodiment, the tube 110 as an example of the heat transfer member is a separate component from the heat sink 104. Therefore, by changing the shape of the tube 110, a structure for heat transfer from the heat pipe 84 to the heat sink 104 may be implemented in a corresponding manner to various shapes of the heat pipe 84.

In the third embodiment, the shape of the through hole 108 as seen in the direction of arrow D is circular and the cross-sectional shape of the other end side of the heat pipe 84 is also circular. The internal diameter of the through hole 108 is greater than the diameter of the other end side (inserted portion to the through hole 108) of the heat pipe 84. Consequently, positional displacement of the heat pipe 84 relative to the heat sink 104 may be accommodated in the height direction (the direction of arrow H), the width direction (the direction of arrow W), and a combined direction of these directions.

In the third embodiment, the tube 110 has a cylindrical shape and surrounds the other end side of the heat pipe 84 by the entire circumference. Therefore, heat may be efficiently transferred from the heat pipe 84 to the heat sink 104.

In the third embodiment, the heat sink 104 has the base member 106. The base member 106 is block-shaped and has a high thermal capacity. Therefore, even when a large quantity of heat is transferred from the heat pipe 84, it is possible to store the heat temporarily. In particular, since the heat pipe 84 is inserted in the through hole 108 of the base member 106, the heat from the heat pipe 84 may be first stored in the base member 106 in a position away from the electronic components.

Since the base member 106 is block-shaped, the heat sink 104 receives the heat from the heat pipe 84 by the entire area in the depth direction. Consequently, heat is transferred from the heat pipe 84 to the heat sink 104 in a wide area, and thus the electronic components 18 may be efficiently cooled.

Next, a fourth embodiment will be described. Also in the fourth embodiment, the same elements, members as in the first embodiment are denoted by the same symbols, and detailed description is omitted. Also, in the fourth embodiment, the general structure of the heat dissipation device is the same as in the first embodiment, and thus illustration thereof is omitted.

Figure 17:
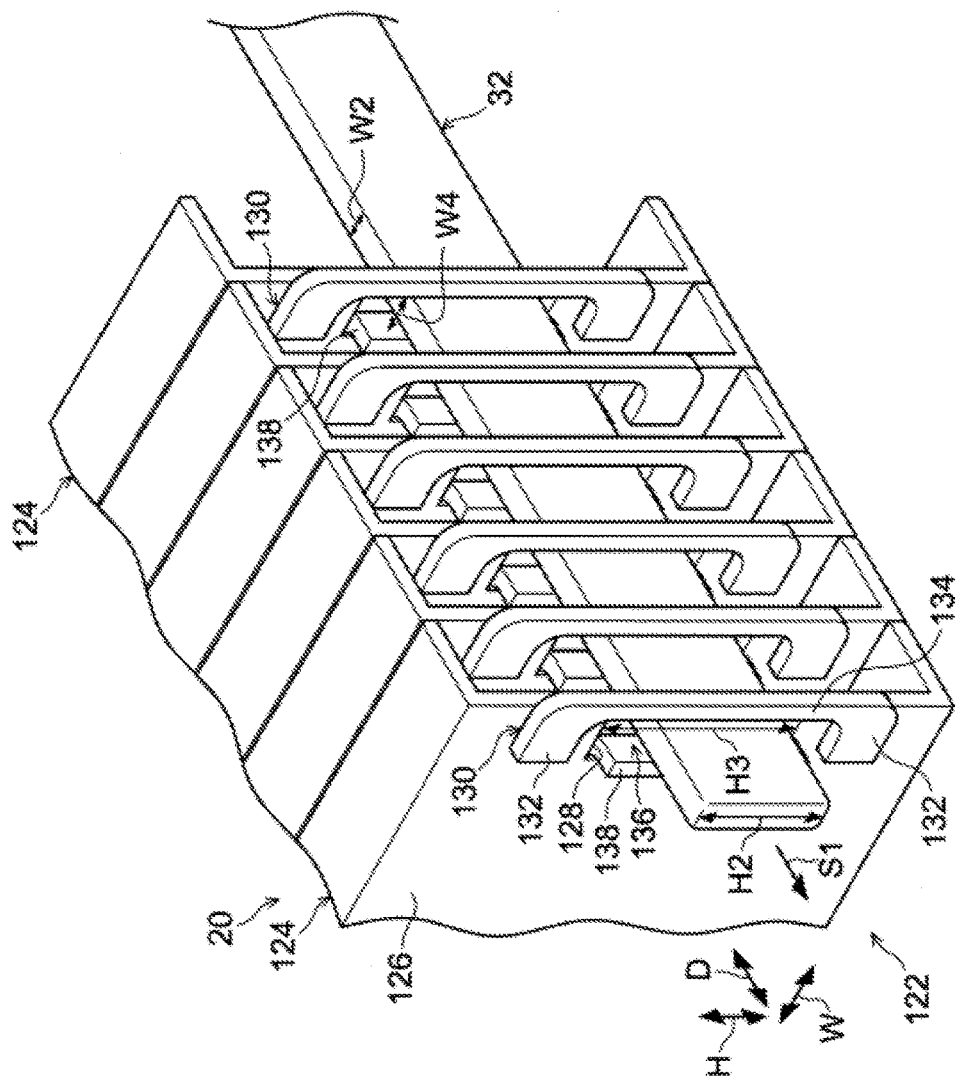
FIG. 17 is an enlarged perspective view illustrating the vicinity of an opening of a heat sink in a fourth embodiment.

In the heat dissipation device 122 in the fourth embodiment, as illustrated in FIG. 17, a recessed portion 128 is formed in a widthwise edge 126E of fin main bodies 126 of the radiating fins 124. The recessed portion 128 is open to the outer side in the width direction. The internal dimension height H3 of the recessed portion 128 is higher than the height H2 of the second flat portion 50 of the heat pipe 32.

In the fourth embodiment, brackets 130 are fixed to the radiating fins 124. Each of the brackets 130 has a flat widthwise U-shape and includes a pair of vertical connection pieces 132 to be connected to a radiating fin 124, and a holding piece 134 continued to the connection pieces 132 on the outer side in the width direction. When seen in the depth direction (the direction of arrow D), a portion within the bracket 130 in the recessed portion 128 is an insertion portion 136 in which the other end of the heat pipe 32 is inserted.

A spring plate 138 extends from the side portion of the recessed portion 128. The spring plate 138 is formed by bending a portion of each fin main body 126 in the same direction (the direction of arrow S1) as the insertion direction of the heat pipe 32, the portion being left after cutting when the recessed portion 128 of the fin main body 126.

With the second flat portion 50 of the heat pipe 32 not inserted in the insertion portion 136, space W4 between the spring plate 138 and the holding piece 134 is narrower than the width W2 of the second flat portion 50. With the second flat portion 50 is located in the insertion portion 136, the spring plate 138 is in contact with the second flat portion 50 to nip the second flat portion 50 by elasticity between the spring plate 138 and the holding piece 134. In the fourth embodiment, the spring plate 138 and the holding piece 134 are each an example of a holding member.

In the fourth embodiment, the spring plate 138 is an example of the heat transfer member. When heat is transferred sufficiently from the heat pipe 32 to heat sink 20 by the spring plate 138, the thermal conductivity of the holding piece 134 may be low. However, the thermal conductivity of the holding piece 134 may be increased to implement a structure that allows heat transfer from the heat pipe 32 to the heat sink 20 through not only the spring plate 138 but also the holding piece 134.

In the fourth embodiment, the heat pipe 32 is located at an end of the heat sink 20 (radiating fins 124) in the width direction. Therefore, even when the position of heat pipe 32 is restricted (for instance, the heat pipe 32 may not be disposed at a position near the center of the heat sink 20 in the width direction), it is possible to transfer the heat from the heat pipe 32 to the heat sink 20.

In the fourth embodiment, the heat pipe 84 inserted in the recessed portion 128 is held by the spring plate 138 and the holding piece 134 (an example of the holding member), and thus the position of the heat pipe 32 relative to the heat sink 20 may be held stably.

In each of the above-described embodiments, the spring plates 60, 138, the bush 88, or the tube 110 as an example of the heat transfer member are disposed between the heat pipe 32 and the openings 58, 86 (the heat sinks 20, 104). Therefore, heat is transferred from the heat pipes 32, 84 to the heat sinks 20, 104, and the heat pipes 32, 84 may be stably held at a desired position relative to the heat sinks 20, 104.

In each of the above-described embodiments, instead of the heat transfer sheet 34, for instance, a viscous material (such as thermal grease) having thermal conductivity may be used. Even with this structure, reducing the thickness of a viscous material allows the heat resistance over a route from the electronic components 18 to the heat receiving members 30 to be decreased.

Furthermore, a structure may be adopted in which the heat receiving member 30 comes into direct contact with the corresponding electronic component 18.

Furthermore, in the above, an example has been illustrated in which the heat receiving member 30 and the heat pipe 32 (the first flat portion 48 and the second flat portion 50) are parallel to the printed circuit board 16. In particular, in the case where the upper surface of the electronic component 18 is parallel to the printed circuit board 16, when the heat receiving member 30 is set to be parallel to the printed circuit board 16, the upper surface of the electronic component 18 and the lower surface of the heat receiving member 30 becomes parallel, and thus deviation in heat transfer may be reduced. In related to this, for instance, in the side views illustrated in FIGS. 3 to 6, the heat receiving member 30 and the heat pipe 32 (the first flat portion 48 and the second flat portion 50) may be inclined with respect to the printed circuit board 16.

In each of the above-described embodiments, one common heat sink 20 is located for a plurality of (three in the example illustrated) electronic components 18. In contrast to a structure in which a heat sink is located for each of the electronic components 18, it is possible to upsize the heat sink 20. The electronic components may be efficiently cooled by dissipating heat using a large-sized heat sink 20. It is also possible to achieve miniaturization of the substrate unit 14 by disposing the electronic components 18 with high density. All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A heat dissipation device comprising:
   a heat sink mounted on a substrate;
   a first opening and a second opening that penetrate the heat sink arranged in parallel direction to the substrate, the first opening is arranged at a first distance from the substrate and the second opening is arranged at the first distance from the substrate;

a first heat receiving member disposed on a first electronic component mounted on the substrate;

a second heat receiving member disposed on a second electronic component mounted on the substrate; and a first heat pipe and a second heat pipe, one end side of the first heat pipe is fixed to the first heat receiving member and other end side of the first heat pipe is inserted in the first opening and fixed at a first position, one end side of the second heat pipe is fixed to the second heat receiving member and other end side of the second heat pipe is inserted in the second opening and fixed at a second position, wherein an inner diameter of the first and second openings in a perpendicular direction to a surface of the substrate is larger than a diameter of the first and second heat pipes in the perpendicular direction to the surface of the substrate, and wherein a height of the second electronic component is higher than a height of the first electronic component, and the second position from the substrate is located higher than the first position.

2. The heat dissipation device according to claim 1, further comprising a heat transfer member located between the first heat pipe and the first opening.

3. The heat dissipation device according to claim 2, wherein the heat transfer member is a spring plate that is formed integrally with the heat sink and in contact with the first heat pipe.

4. The heat dissipation device according to claim 2, wherein the heat transfer member is a bush that is mounted on the heat sink.

5. The heat dissipation device according to claim 1, wherein the heat sink includes:

a base member attached to the substrate; and a plurality of radiating fins located in the base member, and the first and second openings are formed in the base member.

6. The heat dissipation device according to claim 1, wherein the first opening and the second opening is a recessed portion in an edge of the heat sink, and includes a holding member that holds a corresponding one of the first heat pipe and the second heat pipe inserted in the the first opening and the second opening.

7. A method of dissipating heat comprising:

mounting a heat sink on a substrate, the heat sink includes a first opening and a second opening that penetrate the heat sink and arranged in parallel direction to the substrate, the first opening is arranged at a first distance from the substrate and the second opening is arranged at the first distance from the substrate;

disposing a first heat receiving member on a first electronic component mounted on the substrate and receiving heat of the first electronic component by the first heat receiving member;

fixing one end side of a first heat pipe to the first heat receiving member;

inserting other end of the first heat pipe into the first opening which is made larger in a perpendicular direction to the surface of the substrate than inserted portions of the first heat pipe, and having heat transferred from the first heat pipe to the heat sink;

adjusting a position of the first heat pipe at a first position with respect to the heat sink in the perpendicular direction;

disposing a second heat receiving member on a second electronic component mounted on the substrate and receiving heat of the second electronic component by the second heat receiving member;

fixing one end side of a second heat pipe to the second heat receiving member;

inserting other end of the second heat pipe into the second opening which is made larger in a perpendicular direction to the surface of the substrate than inserted portions of the second heat pipe, and having heat transferred from the second heat pipe to the heat sink; and adjusting a position of the second heat pipe at a second position with respect to the heat sink in the perpendicular direction, wherein a height of the second electronic component is higher than a height of the first electronic component, and the second position from the substrate is located higher than the first position.

8. The method of dissipating heat according to claim 7, further comprising locating a heat transfer member between the first heat pipe and the first opening and having heat transferred from the first heat pipe to the heat sink by the heat transfer member.

9. The method of dissipating heat according to claim 8, wherein the heat transfer member has elasticity and holds the first heat pipe to the corresponding the first opening.

10. The method of dissipating heat according to claim 9, wherein the heat transfer member is a pair of spring plates that is formed integrally with the heat sink, and the method further comprises inserting the first heat pipe between the pair of spring plates.

11. The method of dissipating heat according to claim 10, wherein an inserted portion of the first heat pipe between the corresponding pair of spring plates has a long section in the perpendicular direction, and the method further comprises inserting the first heat pipe by causing the corresponding pair of spring plates to come into contact with the inserted portion.

12. The method of dissipating heat according to claim 9, wherein the heat transfer member is a bush that is a separate body from the heat sink, and the method further comprises causing the bush to come into contact with each heat pipe and the heat sink.

13. The method of dissipating heat according to claim 12, wherein the inserted portion of the first heat pipe into the first opening has a circular section, the first opening is a circular section that is larger than the inserted portion in diameter, and the method further comprises inserting the inserted portion of the first heat pipe into the first opening.

14. The method of dissipating heat according to claim 13, wherein the bush is annular and encloses the inserted portion.

15. The method of dissipating heat according to claim 7, wherein the heat sink includes:

a base member which is attached to the substrate and in which the openings are formed; and a plurality of radiating fins vertically located in the base member.

* * * * *